(12) United States Patent
Liu et al.

(10) Patent No.: US 9,825,525 B2
(45) Date of Patent: Nov. 21, 2017

(54) TUNABLE DC VOLTAGE GENERATING CIRCUIT

(71) Applicant: Richtek Technology Corporation, Chupei, Hsinchu (TW)

(72) Inventors: Kuo-Chi Liu, Hsinchu (TW); Wei-Hsin Wei, Hsinchu County (TW)

(73) Assignee: Richtek Technology Corporation, Hsinchu (TW)

( * ) Notice: Subject to any disclaimer, the term of this patent is extended or adjusted under 35 U.S.C. 154(b) by 0 days.

(21) Appl. No.: 15/587,154

(22) Filed: May 4, 2017

(65) Prior Publication Data

US 2017/0237341 A1 Aug. 17, 2017

Related U.S. Application Data

(62) Division of application No. 15/284,755, filed on Oct. 4, 2016.

(30) Foreign Application Priority Data

Feb. 4, 2016 (CN) .......................... 2016 1 0078306

(51) Int. Cl.
*H02M 3/156* (2006.01)
*H02M 3/158* (2006.01)
(Continued)

(52) U.S. Cl.
CPC ............... *H02M 3/06* (2013.01); *H02J 7/025* (2013.01); *H02M 1/4225* (2013.01);
(Continued)

(58) Field of Classification Search
CPC .. H02M 1/4225; H02M 3/156–3/1588; H02M 2001/0054
See application file for complete search history.

(56) References Cited

U.S. PATENT DOCUMENTS 5,708,573 A 1/1998 Lusher et al.
2005/0231177 A1* 10/2005 Tateno ................ H02M 3/1588
323/225
(Continued)

OTHER PUBLICATIONS

Taiwanese Office Communication and Search Report from TIPO for Application No. 105103714, dated Jun. 17, 2016.

*Primary Examiner* — Timothy J Dole
*Assistant Examiner* — Ishrat Jamali
(74) *Attorney, Agent, or Firm* — Birch, Stewart, Kolasch & Birch, LLP (57) ABSTRACT

A tunable DC voltage generating circuit includes: a resonance circuit including an inductor and an input capacitor coupled in a series connection, and arranged to operably receive an input signal and to operably generate a resonance signal at an output node between the inductor and the input capacitor; a rectifying circuit coupled with the output node and arranged to operably rectify the resonance signal; a current control unit coupled with an input of the rectifying circuit and coupled with the inductor or the input capacitor in a parallel connection; a stabilizing capacitor coupled with an output of the rectifying circuit and arranged to operably provide a DC output signal having a voltage level greater than that of the input signal; and a control circuit arranged to operably adjust a current passing through the current control unit according to a setting signal to thereby manipulate the DC output signal.

4 Claims, 9 Drawing Sheets

(51) Int. Cl.
   *H02M 3/06*      (2006.01)
   *H02M 7/06*      (2006.01)
   *H02J 7/02*      (2016.01)
   *H03H 7/38*      (2006.01)
   *H02M 1/42*      (2007.01)
   *H02M 1/00*      (2006.01)

(52) U.S. Cl.
   CPC ........... *H02M 3/156* (2013.01); *H02M 3/158* (2013.01); *H02M 3/1588* (2013.01); *H02M 7/06* (2013.01); *H03H 7/38* (2013.01); *H02M 2001/0054* (2013.01)

(56) References Cited

U.S. PATENT DOCUMENTS

| | | | |
|---|---|---|---|
| 2007/0097578 A1* | 5/2007 | Bartolo | H02M 1/32 361/93.1 |
| 2008/0197817 A1* | 8/2008 | Colbeck | H02M 1/4225 323/205 |
| 2015/0222178 A1* | 8/2015 | Skinner | H02M 1/4225 363/126 |

* cited by examiner

FIG. 9

TUNABLE DC VOLTAGE GENERATING CIRCUIT

CROSS-REFERENCE TO RELATED APPLICATIONS

This application is a Divisional of co-pending U.S. patent application Ser. No. 15/284,755, filed on Oct. 4, 2016, which claims the benefit of priority to Patent Application No. 201610078306.8, filed in China on Feb. 4, 2016; the entirety of which is incorporated herein by reference for all purposes.

BACKGROUND

The disclosure generally relates to a voltage amplifying circuit and, more particularly, to a tunable DC voltage generating circuit with a high voltage conversion ratio.

Switching boost converters are widely used in various applications. However, the voltage conversion ratio of the conventional switching boost converter is not high since the voltage conversion ratio is typically less than ten. Another drawback of the conventional switching boost converter is that it requires a complex control circuit to control the operations of the power switches, and thus the circuitry design of the control circuit is typically complex. Furthermore, the conventional switching boost converter inevitably suffers switching loss due to the switching operations of the power switches.

SUMMARY

An example embodiment of a tunable DC voltage generating circuit is disclosed, comprising: a resonance circuit comprising an inductor and an input capacitor coupled in a series connection, and arranged to operably receive an input signal and to operably generate a resonance signal at an output node between the inductor and the input capacitor; a rectifying circuit, coupled with the output node, arranged to operably rectify the resonance signal; a current control unit, coupled with an input of the rectifying circuit, and coupled with the inductor or the input capacitor in a parallel connection; a stabilizing capacitor, coupled with an output of the rectifying circuit, arranged to operably provide a DC output signal having a voltage level greater than that of the input signal; and a control circuit, coupled with the current control unit and the output of the rectifying circuit, arranged to operably adjust a current passing through the current control unit according to a setting signal to thereby manipulate the DC output signal.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
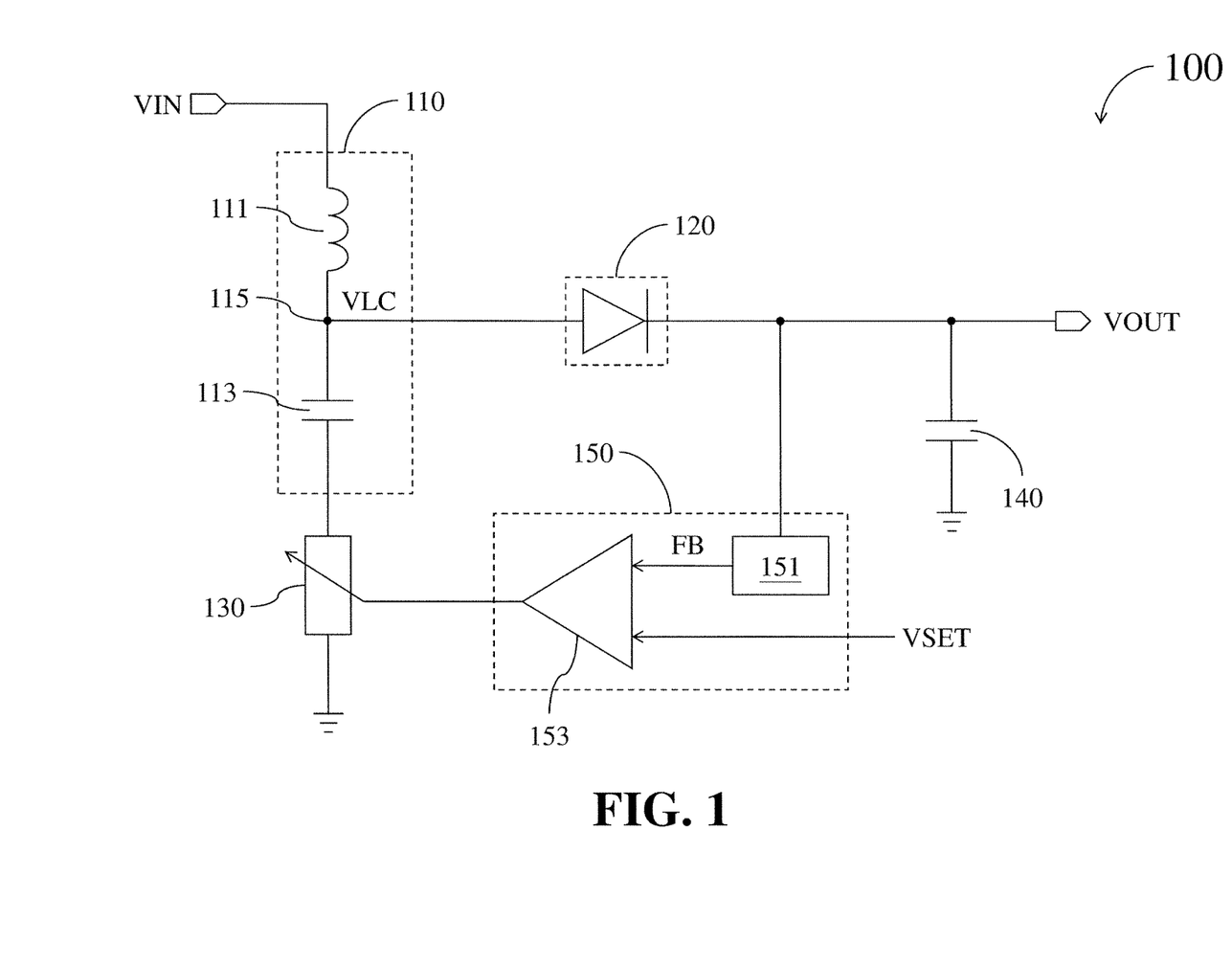
FIG. 1 shows a simplified functional block diagram of a tunable DC voltage generating circuit according to a first embodiment of the present disclosure.

FIG. 1 shows a simplified functional block diagram of a tunable DC voltage generating circuit 100 according to a first embodiment of the present disclosure. As shown in FIG. 1, the tunable DC voltage generating circuit 100 comprises a resonance circuit 110, a rectifying circuit 120, a current control unit 130, a stabilizing capacitor 140, and a control circuit 150.

The resonance circuit 110 comprises an inductor 111, an input capacitor 113, and an output node 115 positioned between the inductor 111 and the input capacitor 113, wherein the inductor 111 and the input capacitor 113 are coupled in a series connection. The resonance circuit 110 is arranged to operably receive an input signal VIN and to operably generate a resonance signal VLC at the output node 115.

The rectifying circuit 120 is coupled with the output node 115 and arranged to operably rectify the resonance signal VLC. In practice, the rectifying circuit 120 may be realized with various rectifier circuits, such as a full-bridge rectifier or a half-bridge rectifier, or may be simply realized with a diode.

The current control unit 130 is coupled with the resonance circuit 110 in a series connection, and arranged to operably manipulate the magnitude of a current passing through the input capacitor 113 under control of the control circuit 150.

The stabilizing capacitor 140 is coupled with the output of the rectifying circuit 120, and arranged to operably provide a DC output signal VOUT having a voltage level greater than the voltage level of the input signal VIN.

The control circuit 150 is coupled with the output of the rectifying circuit 120 and the current control unit 130, and arranged to operably adjust the magnitude of the current passing through the current control unit 130 according to a setting signal VSET so as to manipulate the DC output signal VOUT.

Please note that in order to create resonance between the inductor 111 and the input capacitor 113 of the resonance circuit 110, the input signal VIN of the tunable DC voltage generating circuit 100 should be a variating signal, and cannot be a fixed-voltage DC signal. For example, the input signal VIN of the tunable DC voltage generating circuit 100 may be an AC signal or a pulsed DC signal.

In the embodiment of FIG. 1, a first terminal of the current control unit 130 is coupled with the resonance circuit 110, a second terminal of the current control unit 130 is coupled with a fixed-voltage terminal (such as a ground terminal), and a control terminal of the current control unit 130 is coupled with and controlled by the control circuit 150.

Since the magnitude of the current passing through the input capacitor 113 is affected by the equivalent resistance of the current control unit 130, the control circuit 150 may adjust the equivalent resistance of the current control unit 130 to manipulate the magnitude of the current passing through the current control unit 130 as well as the magnitude of the current passing through the input capacitor 113.

In other words, the control circuit 150 may adjust the magnitude of the current passing through the input capacitor 113 by changing the equivalent resistance of the current control unit 130 to thereby manipulate the voltage level of the DC output signal VOUT.

In this embodiment, for example, the control circuit 150 may comprise a feedback circuit 151 and a comparator 153. As shown in FIG. 1, the feedback circuit 151 is coupled with the input of the stabilizing capacitor 140, and arranged to operably generate a feedback signal FB corresponding to the DC output signal VOUT. The comparator 153 is coupled with the feedback circuit 151 and the current control unit 130, and arranged to operably compare the feedback signal FB with the setting signal VSET to manipulate the equivalent resistance of the current control unit 130.

In practice, the current control unit 130 may be realized with a tunable resistor or a transistor, or may be realized with a transistor and an impedance element coupled in a series connection. The feedback circuit 151 may be realized with appropriate divider resistors for lowering the voltage level of the input signal of the comparator 153, thereby reducing the circuitry complexity of the comparator 153.

If the voltage levels of the feedback signal FB and the DC output signal VOUT were configured to be 100:1, when the setting signal VSET is set to 2 volts, the DC output signal VOUT generated by the tunable DC voltage generating circuit 100 can have a voltage level of 200 volts in the steady state. In other words, the voltage level of the DC output signal VOUT can be manipulated to a desire level by utilizing an external circuit (not shown in FIG. 1) to adjust the setting signal VSET, thereby changing the voltage conversion ratio of the tunable DC voltage generating circuit 100.

In the tunable DC voltage generating circuit 100 of FIG. 1, the input signal VIN is conducted to the input capacitor 113 through the inductor 111. But this is merely an embodiment, rather than a restriction to the practical implementations of the prevent invention.

Figure 2:
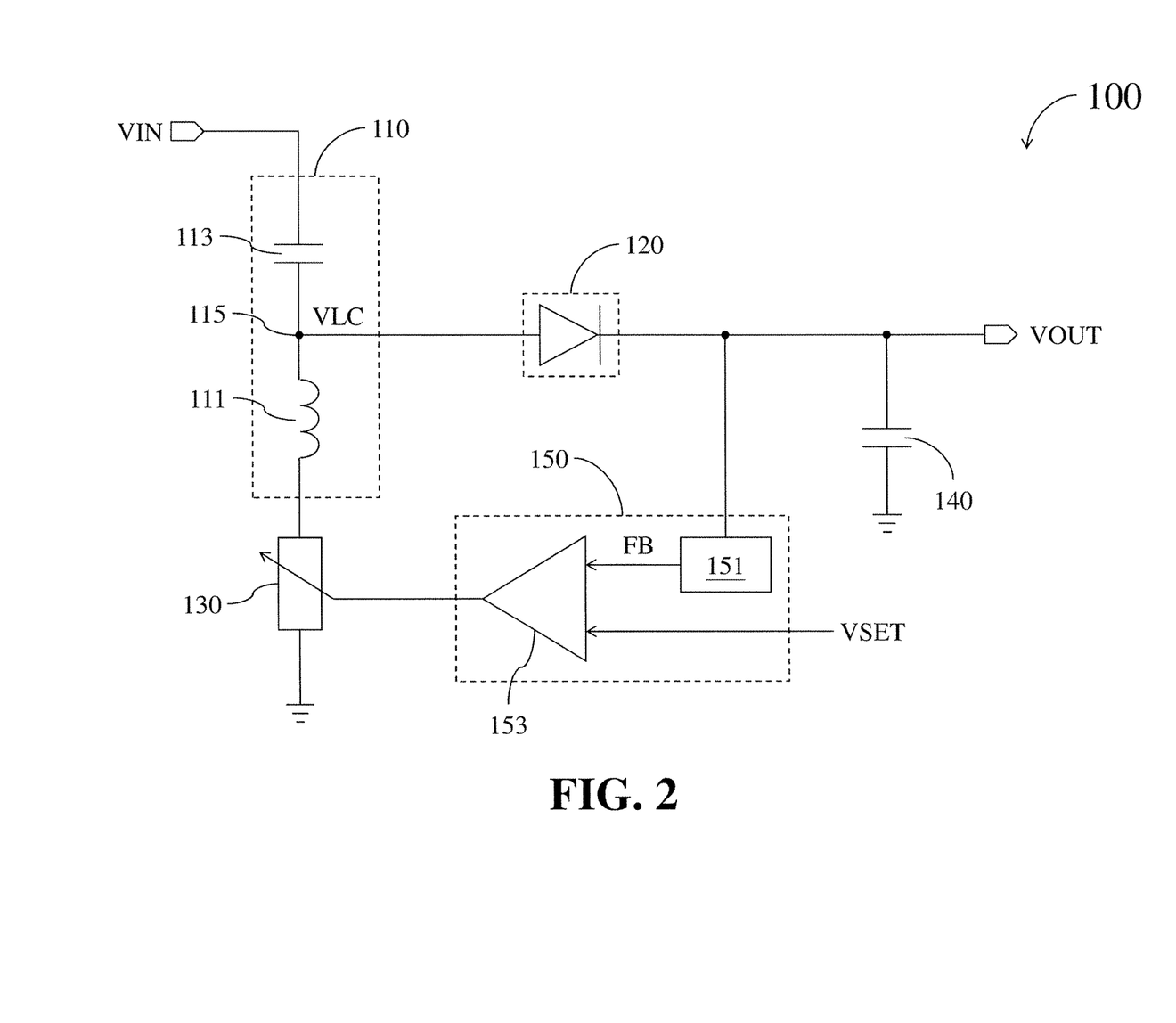
FIG. 2 shows a simplified functional block diagram of a tunable DC voltage generating circuit according to a second embodiment of the present disclosure.

For example, FIG. 2 shows a simplified functional block diagram of the tunable DC voltage generating circuit 100 according to a second embodiment of the present disclosure. In comparison with the structure shown in FIG. 1, the positions of the inductor 111 and the input capacitor 113 of the resonance circuit 110 in FIG. 2 are swapped. In this situation, the input signal VIN is conducted to the inductor 111 through the input capacitor 113.

The foregoing descriptions regarding the implementations, connections, operations, and related advantages of other corresponding functional blocks in FIG. 1 are also applicable to the embodiment of FIG. 2. For the sake of brevity, those descriptions will not be repeated here.

In the previous descriptions, the current control unit 130 and the resonance circuit 110 are coupled in a series connection. But this is merely an embodiment, rather than a restriction to the practical implementations of the prevent invention.

Figure 3:
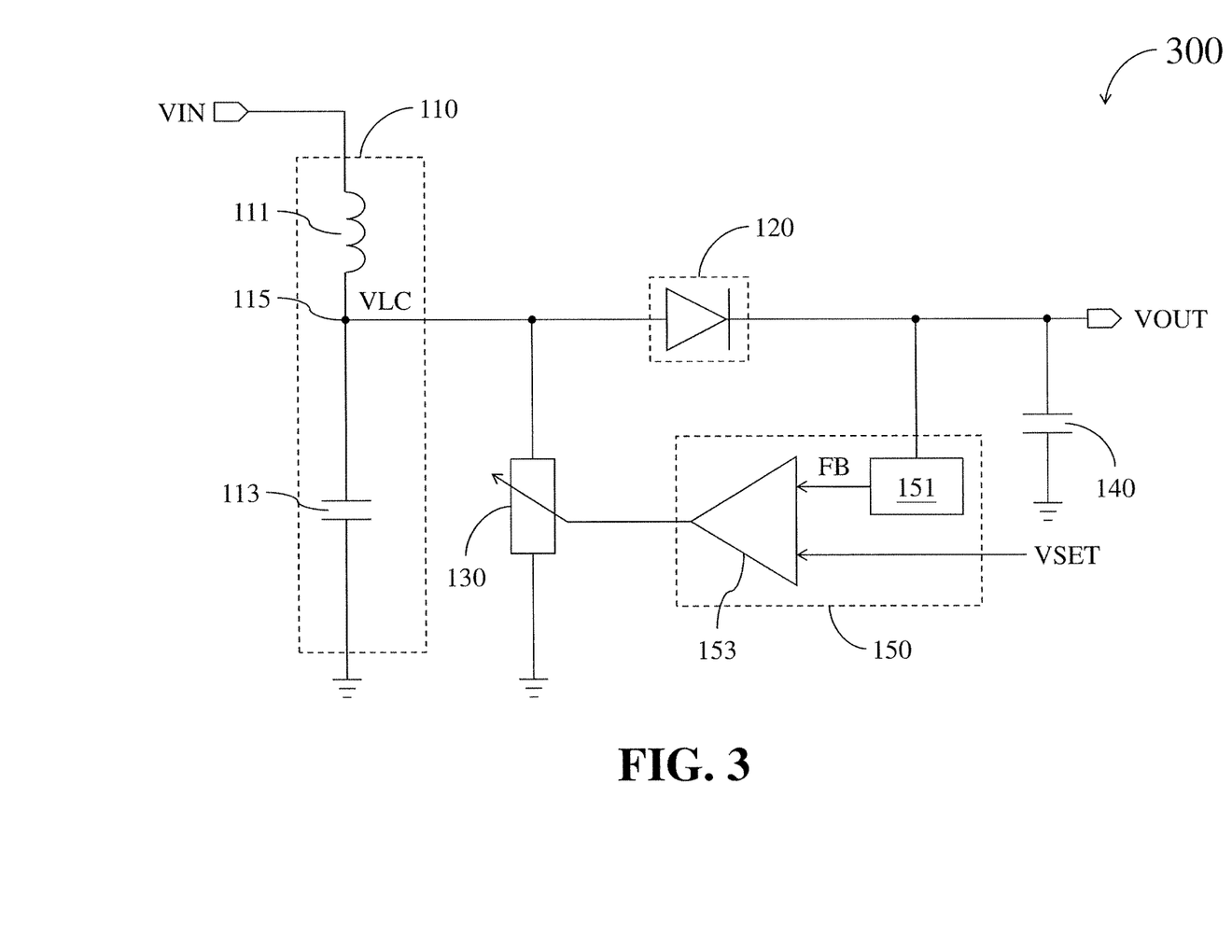
FIG. 3 shows a simplified functional block diagram of a tunable DC voltage generating circuit according to a third embodiment of the present disclosure.
Figure 4:
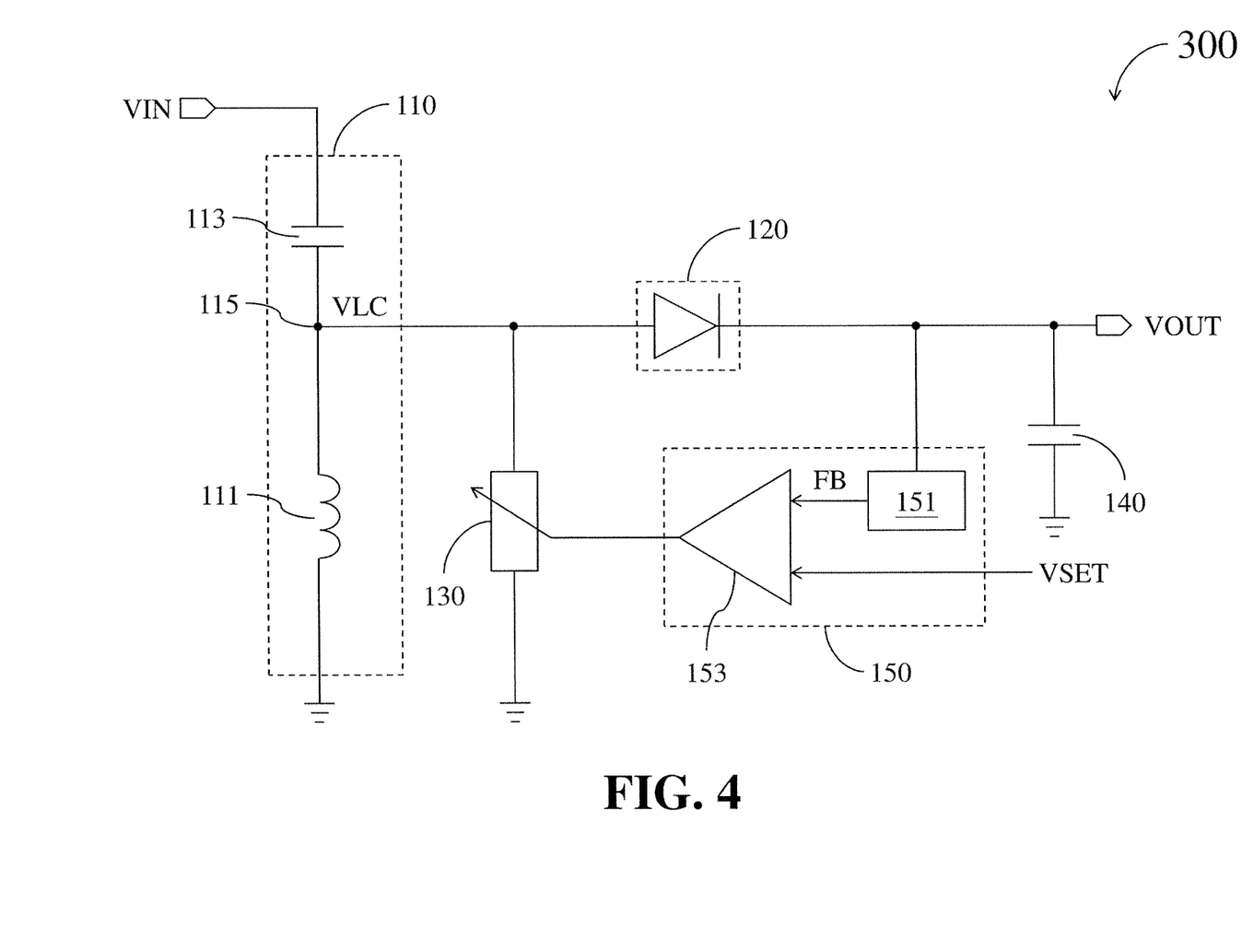
FIG. 4 shows a simplified functional block diagram of a tunable DC voltage generating circuit according to a fourth embodiment of the present disclosure.

For example, please refer to FIG. 3 and FIG. 4. FIG. 3 shows a simplified functional block diagram of a tunable DC voltage generating circuit 300 according to a third embodiment of the present disclosure. FIG. 4 shows a simplified functional block diagram of the tunable DC voltage generating circuit 300 according to a fourth embodiment of the present disclosure.

The components of the tunable DC voltage generating circuit 300 of FIG. 3 and FIG. 4 are similar to the tunable DC voltage generating circuit 100 described previously, but the component connections are somewhat different.

In the embodiments of FIG. 3 and FIG. 4, the first terminal of the current control unit 130 is coupled with the input of the rectifying circuit 120, the second terminal of the current control unit 130 is coupled with a fixed-voltage terminal (such as a ground terminal), and the control terminal of the current control unit 130 is coupled with and controlled by the control circuit 150.

In other words, the current control unit 130 of the tunable DC voltage generating circuit 300 is coupled with the input of the rectifying circuit 120, and also coupled with the inductor 111 or the input capacitor 113 in a parallel connection, instead of coupling with the resonance circuit 110 in a series connection.

In the tunable DC voltage generating circuit 300, the magnitude of current passing through the input capacitor 113 is also affected by the equivalent resistance of the current control unit 130. Similarly, the control circuit 150 may adjust the magnitude of the current passing through the input capacitor 113 by changing the equivalent resistance of the current control unit 130 to thereby manipulate the voltage level of the DC output signal VOUT.

In comparison with the structure shown in FIG. 3, the positions of the inductor 111 and the input capacitor 113 of the resonance circuit 110 in FIG. 4 are swapped. In this situation, the input signal VIN is conducted to the inductor 111 through the input capacitor 113.

The foregoing descriptions regarding the implementations, connections, operations, and related advantages of other corresponding functional blocks in FIG. 1 are also applicable to the embodiments of FIG. 3 and FIG. 4. For the sake of brevity, those descriptions will not be repeated here.

In the previous embodiments of FIG. 3 and FIG. 4, the current control unit 130 is coupled with the input of the rectifying circuit 120. But this is merely an embodiment, rather than a restriction to the practical implementations of the prevent invention.

Figure 5:
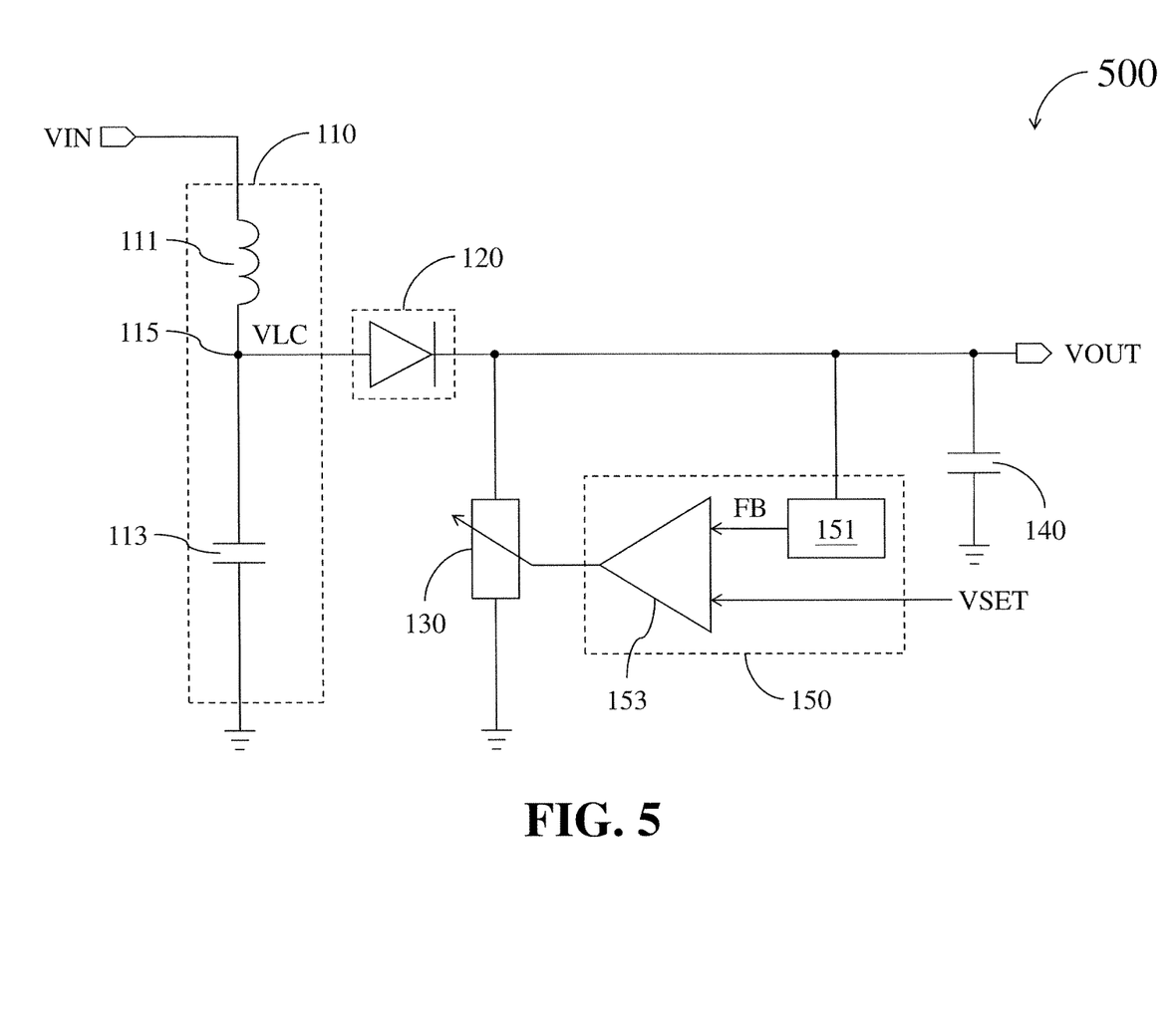
FIG. 5 shows a simplified functional block diagram of a tunable DC voltage generating circuit according to a fifth embodiment of the present disclosure.
Figure 6:
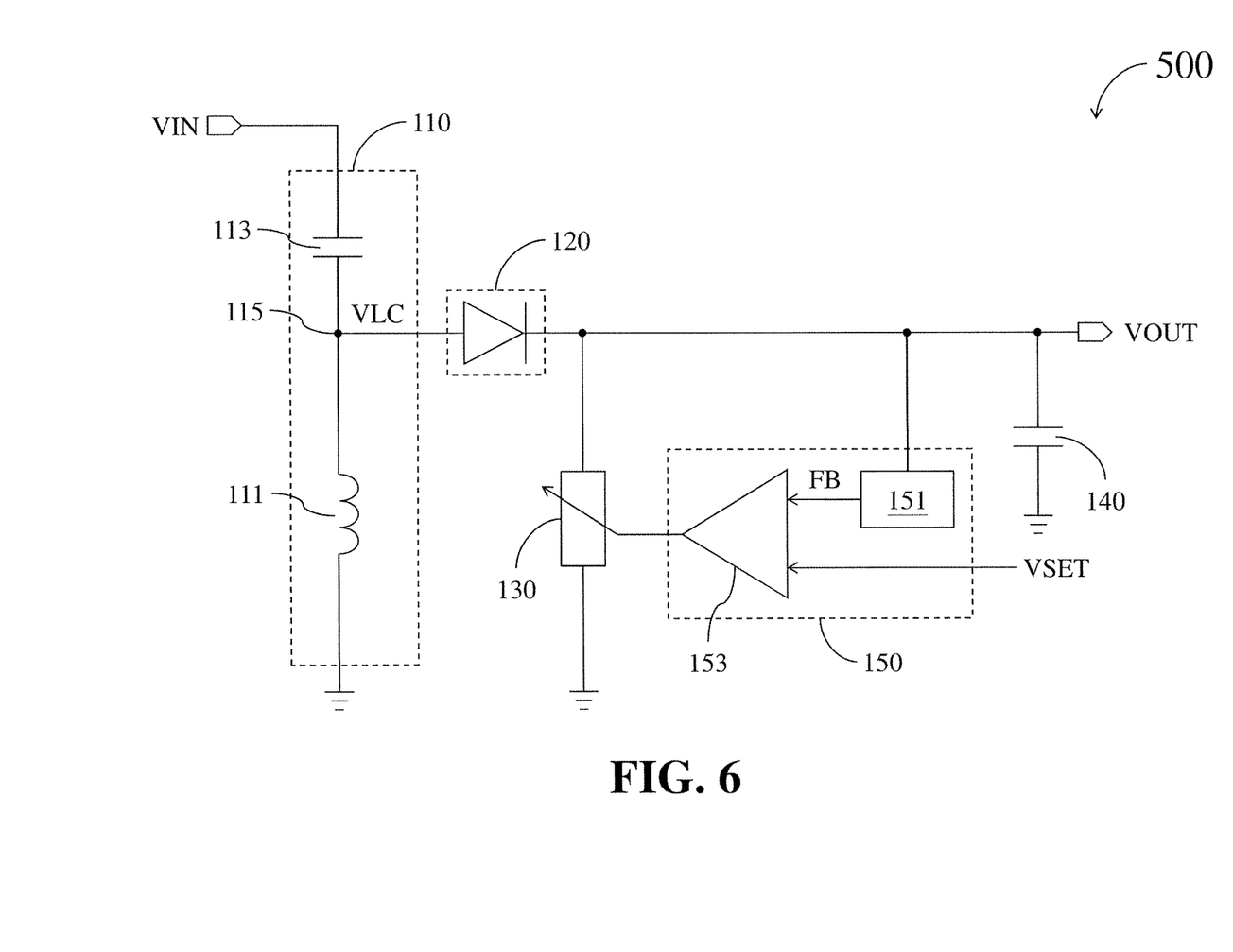
FIG. 6 shows a simplified functional block diagram of a tunable DC voltage generating circuit according to a sixth embodiment of the present disclosure.

For example, please refer to FIG. 5 and FIG. 6. FIG. 5 shows a simplified functional block diagram of a tunable DC voltage generating circuit 500 according to a fifth embodiment of the present disclosure. FIG. 6 shows a simplified functional block diagram of the tunable DC voltage generating circuit 500 according to a sixth embodiment of the present disclosure.

The components of the tunable DC voltage generating circuit 500 of FIG. 5 and FIG. 6 are similar to the tunable DC voltage generating circuit 300 described previously, but the component connections are somewhat different.

In the embodiments of FIG. 5 and FIG. 6, the first terminal of the current control unit 130 is coupled with the output of the rectifying circuit 120, the second terminal of the current control unit 130 is coupled with a fixed-voltage terminal (such as a ground terminal), and the control terminal of the current control unit 130 is coupled with and controlled by the control circuit 150.

In other words, the current control unit 130 of the tunable DC voltage generating circuit 500 is coupled with the output of the rectifying circuit 120, and also coupled with the inductor 111 or the input capacitor 113 in a parallel connection, instead of coupling with the resonance circuit 110 in a series connection.

In the tunable DC voltage generating circuit 500, the magnitude of current passing through the input capacitor 113 is also affected by the equivalent resistance of the current control unit 130. Similarly, the control circuit 150 may adjust the magnitude of the current passing through the input capacitor 113 by changing the equivalent resistance of the current control unit 130 to thereby manipulate the voltage level of the DC output signal VOUT.

In comparison with the structure shown in FIG. 5, the positions of the inductor 111 and the input capacitor 113 of the resonance circuit 110 in FIG. 6 are swapped. In this situation, the input signal VIN is conducted to the inductor 111 through the input capacitor 113.

The foregoing descriptions regarding the implementations, connections, operations, and related advantages of other corresponding functional blocks in the previous embodiments are also applicable to the embodiments of FIG. 5 and FIG. 6. For the sake of brevity, those descriptions will not be repeated here.

In can be appreciated from the foregoing elaborations, the voltage level of the DC output signal VOUT generated by the disclosed tunable DC voltage generating circuit 100, 300, or 500 can be higher than ten times or hundred times of the voltage level of the input signal VIN. Accordingly, each of the disclosed tunable DC voltage generating circuits 100, 300, and 500 has a very wide voltage conversion range, and is enabled to offer great application flexibility.

In addition, it is clear that no power switch is employed in the aforementioned tunable DC voltage generating circuit 100, 300, or 500. As a result, the aforementioned tunable DC voltage generating circuit 100, 300, or 500 has no switching loss, and thus the circuitry design complexity of the control circuit 150 is much lower than that of the control circuit for use in the conventional switching power converter.

As described previously, the voltage conversion ratio of the disclosed tunable DC voltage generating circuit 100, 300, or 500 can be manipulated to a desire value by utilizing an external circuit to adjust the setting signal VSET. Accordingly, the disclosed tunable DC voltage generating circuits 100, 300, and 500 are vary suitable in the applications where the circuits in the later stage require a wide voltage variation range.

Figure 7:
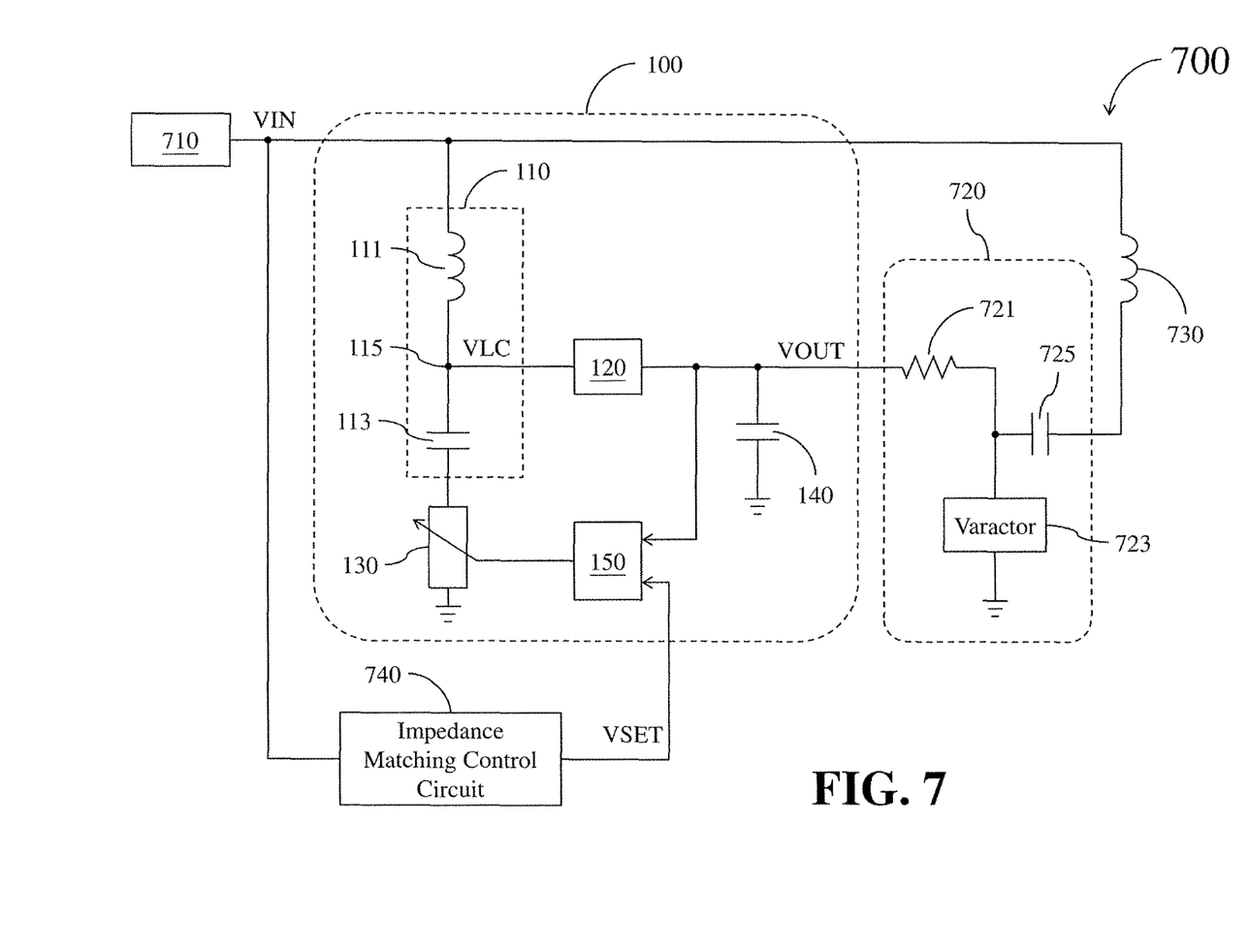
FIG. 7 shows a simplified functional block diagram of a wireless charging device according to a first embodiment of the present disclosure.

For example, FIG. 7 shows a simplified functional block diagram of a wireless charging device 700 according to a first embodiment of the present disclosure. The wireless charging device 700 comprises a power supply unit 710, an impedance matching network 720, a charging inductor 730, an impedance matching control circuit 740, and the aforementioned tunable DC voltage generating circuit 100.

The power supply unit 710 is utilized for supplying the input signal VIN required by the tunable DC voltage generating circuit 100. In practice, the power supply unit 710 may be realized with various full bridge power amplifiers, half bridge power amplifiers, Class-D amplifiers, or any other circuit capable of generating an appropriate AC signal or pulsed DC signal.

The impedance matching network 720 is coupled with the output of the tunable DC voltage generating circuit 100 and arranged to operably match the impedance of the charging inductor 730. For example, the impedance matching network 720 may comprise a resistor 721, a varactor 723, and an output capacitor 725. The resistor 721 is coupled between the output of the tunable DC voltage generating circuit 100 and the input of the varactor 723. The output capacitor 725 is coupled between the input of the varactor 723 and the charging inductor 730.

The charging inductor 730 is coupled between the output terminal of the power supply unit 710 and the output terminal of the impedance matching network 720, and arranged to operably deliver energy to another device (such as a mobile device equipped with wireless power receiving apparatus) through electromagnetic induction manner, so as to wirelessly charge that device.

The impedance matching control circuit 740 is coupled with the output terminal of the power supply unit 710 and the input terminal of the aforementioned control circuit 150, and arranged to operably generate the aforementioned setting signal VSET. The impedance matching control circuit 740 may estimate the signal phases at the output capacitor 725 and the charging inductor 730 based on the input signal VIN. In addition, the impedance matching control circuit 740 may adjust the magnitude of the setting signal VSET to match the signal phases at the output capacitor 725 and the charging inductor 730 through the operations of the tunable DC voltage generating circuit 100, thereby increasing the overall energy conversion efficiency of the wireless charging device 700.

As described previously, the positions of the inductor 111 and the input capacitor 113 of the resonance circuit 110 in FIG. 7 may be swapped.

Figure 8:
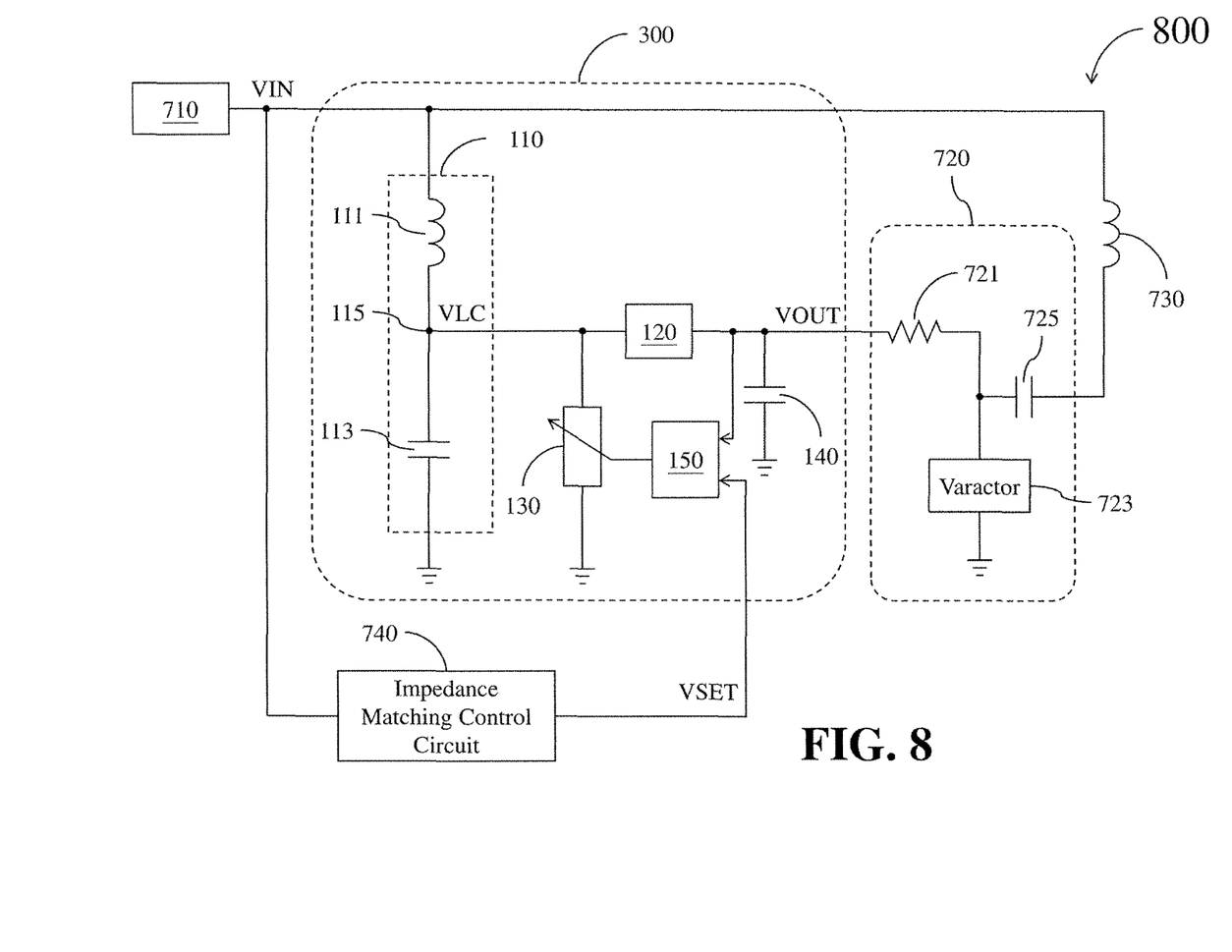
FIG. 8 shows a simplified functional block diagram of a wireless charging device according to a second embodiment of the present disclosure.
Figure 9:
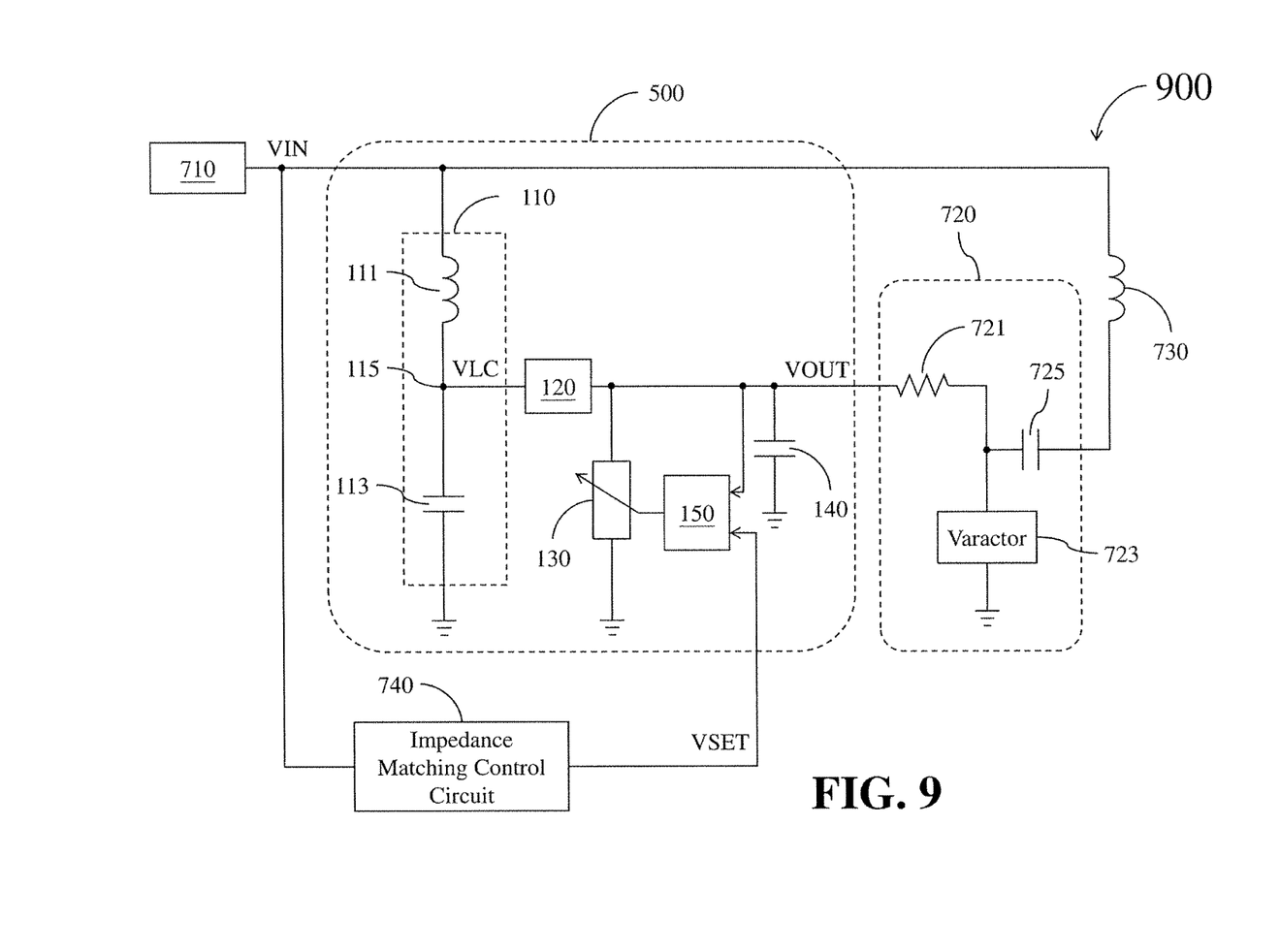
FIG. 9 shows a simplified functional block diagram of a wireless charging device according to a third embodiment of the present disclosure.

Please refer to FIG. 8 and FIG. 9. FIG. 8 shows a simplified functional block diagram of a wireless charging device 800 according to a second embodiment of the present disclosure. FIG. 9 shows a simplified functional block diagram of a wireless charging device 900 according to a third embodiment of the present disclosure. The wireless charging device 800 and the wireless charging device 900 are both similar to the wireless charging device 700, but the wireless charging device 800 replaces the tunable DC voltage generating circuit 100 in the wireless charging device 700 with the aforementioned tunable DC voltage generating circuit 300, and the wireless charging device 900 replaces the tunable DC voltage generating circuit 100 in the wireless charging device 700 with the aforementioned tunable DC voltage generating circuit 500.

The foregoing descriptions regarding the implementations, connections, operations, and related advantages of other corresponding functional blocks in the embodiment of FIG. 7 are also applicable to the embodiments of FIG. 8 and FIG. 9. For the sake of brevity, those descriptions will not be repeated here.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open- ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The term "voltage signal" used throughout the description and the claims may be expressed in the format of a current in implementations, and the term "current signal" used throughout the description and the claims may be expressed in the format of a voltage in implementations.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A tunable DC voltage generating circuit (300), comprising:
    a resonance circuit (110) comprising an inductor (111) and an input capacitor (113) coupled in a series connection, and arranged to operably receive an input signal (VIN) and to operably generate a resonance signal (VLC) at an output node (115) between the inductor (111) and the input capacitor (113);
    a rectifying circuit (120), coupled with the output node (115), arranged to operably rectify the resonance signal (VLC);
    a current control unit (130), coupled with an input of the rectifying circuit (120), and coupled with the inductor (111) or the input capacitor (113) in a parallel connection;
    a stabilizing capacitor (140), coupled with an output of the rectifying circuit (120), arranged to operably provide a DC output signal (VOUT) having a voltage level greater than that of the input signal (VIN); and
    a control circuit (150), coupled with the current control unit (130) and the output of the rectifying circuit (120), arranged to operably adjust a current passing through the current control unit (130) according to a setting signal (VSET) to thereby manipulate the DC output signal (VOUT).

2. The tunable DC voltage generating circuit (300) of claim 1, wherein the input signal (VIN) is an AC signal or a pulsed DC signal, not a fixed-voltage DC signal.

3. The tunable DC voltage generating circuit (300) of claim 1, wherein the current control unit (130) comprises a tunable resistor or a transistor, and an equivalent resistance of the current control unit (130) is controlled by the control circuit (150).

4. The tunable DC voltage generating circuit (300) of claim 3, wherein the control circuit (150) comprises:
    a feedback circuit (151), coupled with an input of the stabilizing capacitor (140), arranged to operably generate a feedback signal (FB) corresponding to the DC output signal (VOUT); and
    a comparator (153), coupled with the feedback circuit (151) and the current control unit (130), arranged to operably compare the feedback signal (FB) with the setting signal (VSET) to adjust the equivalent resistance of the current control unit (130).

* * * * *